United States Patent
Krautbauer et al.

(10) Patent No.: US 7,202,146 B2
(45) Date of Patent: Apr. 10, 2007

(54) PROCESS FOR PRODUCING DOPED SEMICONDUCTOR WAFERS FROM SILICON, AND THE WAFERS PRODUCED THEREBY

(75) Inventors: Rupert Krautbauer, Muehldorf (DE); Christoph Frey, Freiberg (DE); Simon Zitzelsberger, Burghausen (DE); Lothar Lehmann, Freiberg (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 11/199,603

(22) Filed: Aug. 9, 2005

(65) Prior Publication Data

US 2006/0035448 A1    Feb. 16, 2006

(30) Foreign Application Priority Data

Aug. 12, 2004   (DE) ................ 10 2004 039 197

(51) Int. Cl.
*H01L 21/425* (2006.01)
*H01L 21/22* (2006.01)
*H01L 29/167* (2006.01)

(52) U.S. Cl. .............. 438/514; 438/517; 438/546; 257/607; 257/633

(58) Field of Classification Search .......... 438/514, 438/517, 527, 546, 548, 557, 558, 566; 257/607, 257/610, 633
See application file for complete search history.

(56) References Cited

U.S. PATENT DOCUMENTS 4,631,234 A    12/1986 Larrabee
5,553,566 A    9/1996 Chiou et al.
5,676,751 A  * 10/1997 Banan et al. ............... 117/13
5,744,396 A    4/1998 Chiou et al.
6,506,321 B1 * 1/2003 Yamashita et al. ....... 252/521.3
2002/0142171 A1 10/2002 Asayama et al.
2003/0047130 A1  3/2003 Sreedharamurthy et al.

FOREIGN PATENT DOCUMENTS

| DE | 3232259 A1 | 3/1984 |
| EP | 1 039 557 A1 | 9/2000 |
| JP | 2003-146795 A | 5/2003 |
| JP | 2003-160395 A | 6/2003 |
| WO | WO 98/03353 A1 | 1/1998 |

OTHER PUBLICATIONS

Patent Abstracts of Japan corresponding to JP 2003-160395.
Patent Abstracts of Japan corresponding to JP 2003-146795.
English Derwent Abstracts AN 1984-057159 corresponding to DE3232259.

* cited by examiner

*Primary Examiner*—Hsien-Ming Lee
(74) *Attorney, Agent, or Firm*—Brooks Kushman P.C.

(57) ABSTRACT

A process for producing doped semiconductor wafers from silicon, which contain an electrically active dopant, such as boron, phosphorus, arsenic or antimony, optionally are additionally doped with germanium and have a defined thermal conductivity, involves producing a single crystal from silicon and processing further to form semiconductor wafers, the thermal conductivity being established by selecting a concentration of the electrically active dopant and optionally a concentration of germanium. Semiconductor wafers produced from silicon by the process have specific properties with regard to thermal conductivity and resistivity.

13 Claims, 1 Drawing Sheet

PROCESS FOR PRODUCING DOPED SEMICONDUCTOR WAFERS FROM SILICON, AND THE WAFERS PRODUCED THEREBY

BACKGROUND OF THE INVENTION

1. Field of the Invention

The invention relates to a process for producing doped semiconductor wafers from silicon, which contain an electrically active dopant such as boron, phosphorus, arsenic or antimony, if appropriate are additionally doped with germanium, and which have a defined thermal conductivity. The invention also relates to semiconductor wafers formed from silicon, which are doped with germanium in a concentration of up to $2 \cdot 10^{20}$ atoms/cm$^3$ and with an electrically active dopant, and which have specific properties with regard to thermal conductivity (TC) and resistivity (R).

2. Background Art

It is fundamentally advantageous if the semiconductor wafer, as a base material (substrate) for electronic components, is supplied with defined physical properties when possible. Ideally, a substrate should have only slight fluctuations in all principle parameters both within a single wafer and between different wafers of the same specification. The thermal conductivity of substrates is one such crucial property which is of great importance to process management in the fabrication of electronic components and with regard to the properties of the finished products. For example, the thermal conductivity of semiconductor wafers formed from silicon plays a crucial role in determining the properties of these wafers during processing to form electronic components and the possible range of uses for the finished component. Consequently, substrates with a well-defined and uniform thermal conductivity are desirable.

However, the thermal conductivity of semiconductor wafers formed from silicon is complex and expensive to measure, and consequently this parameter is not measured in standard production. Thermal conductivity is composed of a phononic component and an electronic component. Both contributions are important in single-crystal silicon at room temperature. The electronic component of the thermal conductivity is substantially proportional to the electrical conductivity of the substrate, while the phononic component is related to the distribution of the atomic masses in the solid state. It is known that pure-isotope silicon has a particularly high thermal conductivity, whereas doping elements lower the thermal conductivity.

SUMMARY OF THE INVENTION

It is an object of the present invention to provide a process which allows the production of semiconductor wafers from silicon which have a predetermined thermal conductivity. This and other objects are achieved by a process for producing doped semiconductor wafers from silicon, which contain an electrically active dopant such as boron, phosphorus, arsenic or antimony, if appropriate are additionally doped with germanium, and have a defined thermal conductivity, wherein a single crystal is produced from silicon and processed further to form semiconductor wafers, with the thermal conductivity being set by selecting the concentration of the electrically active dopant and, if appropriate, by means of the concentration of germanium.

DETAILED DESCRIPTION OF THE PREFERRED EMBODIMENT(S)

Figure 1:
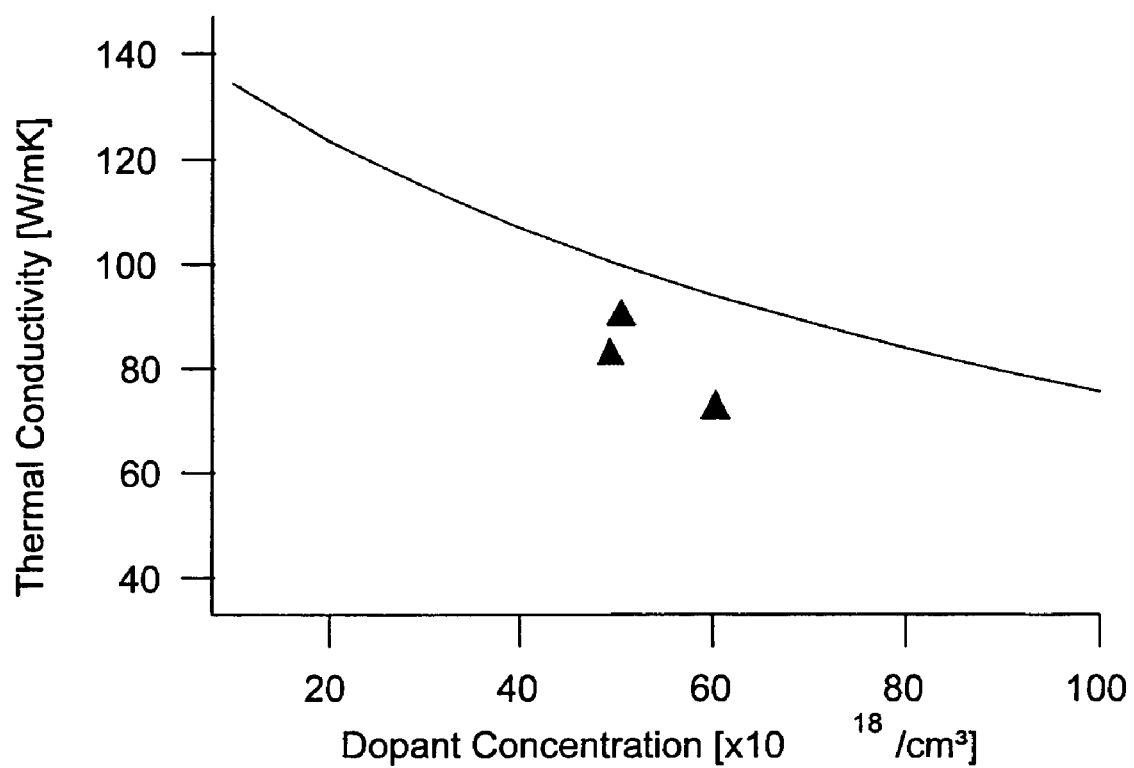
FIG. 1 illustrates calculated and measured thermo-conductivities of phosphorus doped wafers.

The inventors have discovered that for silicon which has been doped with an electrically active dopant, such as boron, phosphorus, arsenic or antimony, thermal conductivity is a fixedly defined physical property described by the formula:

$$k=1/(6.8 \cdot 10^{-3}+\text{alpha} \cdot c(\text{Dop})) \qquad (1)$$

with an accuracy of a few percent, in which formula the thermal conductivity at a temperature of 22° C. is given in the units W/mK, c(Dop) is the selected concentration of the electrically active dopant in atoms/cm$^3$, and alpha is a coefficient which has the following values depending on the electrically active dopant:

| | Dopant: | | | |
|---|---|---|---|---|
| | Boron | Phosphorus | Arsenic | Antimony |
| alpha: | $9.57 \cdot 10^{-23}$ | $6.42 \cdot 10^{-23}$ | $2.11 \cdot 10^{-22}$ | $1.30 \cdot 10^{-21}$. |

If it is desired to set the thermal conductivity to a value which is not included within the range of values predetermined by formula (1), the range of values can be extended by additional doping with germanium in a concentration of up to $2 \cdot 10^{20}$ atoms/cm$^3$, specifically into regions which have not hitherto been accessible. In these cases, the thermal conductivity is set in accordance with the formula $$k=(1-5.6 \cdot 10^{-21} \cdot c(\text{Ge})+1.4 \cdot 10^{-41} \cdot c(\text{Ge})^2)/(6.8 \cdot 10^{-3}+\text{alpha} \cdot c(\text{Dop})) \qquad (2)$$

by selecting the concentrations of germanium and of the electrically active dopant, in which formula k is the thermal conductivity at a temperature of 22° C. in W/mK, c(Ge) and c(Dop) are the selected concentrations of germanium and of the electrically active dopant, in atoms/cm$^3$, and alpha is a coefficient which has the following values depending on the electrically active dopant:

| | Dopant: | | | |
|---|---|---|---|---|
| | Boron | Phosphorus | Arsenic | Antimony |
| alpha: | $9.57 \cdot 10^{-23}$ | $6.42 \cdot 10^{-23}$ | $2.11 \cdot 10^{-22}$ | $1.30 \cdot 10^{-21}$. |

The invention also relates to semiconductor wafers formed from silicon, optionally with a deposited epitaxial coating, the wafers being doped with germanium in a concentration of up to $2 \cdot 10^{20}$ atoms/cm$^3$ and with boron, and having one of the following combinations of properties with regard to thermal conductivity (TC) and the resistivity (R):
a) TC<105 W/mK; R>5 mOhmcm
b) TC=90 W/mK–30 W/mK; R=5–3 mOhmcm
c) TC=80 W/mK–20 W/mK; R=3–2 mOhmcm
d) TC=70 W/mK–20 W/mK; R=2–1.5 mOhmcm
e) TC<50 W/mK; R<1.5 mOhmcm.

Furthermore, the invention relates to semiconductor wafers formed from silicon, optionally with a deposited epitaxial coating, the semiconductor wafers being doped with germanium in a concentration of up to $2 \cdot 10^{20}$ atoms/cm$^3$ and with phosphorus, and having one of the following combinations of properties with regard to the thermal conductivity (TC) and the resistivity (R):
a) TC=90 W/mK–50 W/mK; R=1.5–1.2 mOhmcm
b) TC=80 W/mK–40 W/mK; R=1.2–0.9 mOhmcm
c) TC=75 W/mK–30 W/mK; R<0.9 mOhmcm.

Doping with germanium and an electrically active dopant is particularly preferred if germanium is already being used as dopant in any case on account of other effects which it achieves and in cases in which the thermal conductivity is supposed to be lower than the thermal conductivity which would be achieved after selection of a specific concentration of the electrical dopant in accordance with formula (1). Further effects of germanium as dopant are in particular an increase in the mechanical strength and a reduction in lattice stresses, dealt with, for example, in U.S. Pat. Nos. 5,553,566, 5,744,396, 4,631,234, JP-2003160395 A and JP-2003146795 A.

In addition, the single crystal may also contain further dopants which have only a relatively minor influence on the thermal conductivity, e.g. in the form of a co-doping with nitrogen and/or carbon.

The electrically active dopant may already be contained in the melt during production of the single crystal, in which case the single crystal is preferably pulled using the Czochralski method. However, it is also possible for the electrically active dopant only to be introduced into the semiconductor wafers which have been separated from the single crystal at a later stage, through diffusion or ion implantation. It is preferable for germanium to be provided together with the melt.

In principle, the axial distribution of dopants in a single crystal formed from silicon and pulled by the Czochralski method is determined by the segregation constant of the corresponding dopant. However, it is also known that the radial and axial distribution of dopants in the single crystal can be influenced. The most important influencing factors include the direction of rotation and the rotational speed of single crystal and crucible as well as the pressure conditions and the flow of shielding gas during the pulling process. By suitable selection of these parameters, it is possible to produce single crystals with low radial and axial variations in the dopant content. For example, by suitable selection of the pressure conditions, it is possible to control the evaporation of arsenic, antimony or phosphorus out of the silicon melt in such a way that the axial and radial variation in the resistivity in the single crystal amounts to only a few percent. Therefore, in conjunction with the process according to the invention, depending on the parameters selected, it becomes possible to produce single crystals with a fixedly defined axial profile of thermal conductivity or a thermal conductivity which is homogeneous over large parts of the single crystal. Undesirable variations in processing and product properties can then be reduced by virtue of the accurately defined thermal conductivity.

With boron as the electrically active dopant, it is most preferable to use a process according to the invention in which one of the following combinations of properties results with regard to the thermal conductivity (TC) and the resistivity (R) of the semiconductor wafers:
a) TC<105 W/mK; R>5 mOhmcm
b) TC=90 W/mK–30 W/mK; R=5–3 mOhmcm
c) TC=80 W/mK–20 W/mK; R=3–2 mOhmcm
d) TC=70 W/mK–20 W/mK; R=2–1.5 mOhmcm
e) TC<50 W/mK; R<1.5 mOhmcm.

The radial variation in the resistivity is in this case preferably less than 8%.

With phosphorus as the electrically active dopant, it is most preferable to use a process according to the invention in which one of the following combinations of properties results with regard to the thermal conductivity (TC) and the resistivity (R) of the semiconductor wafers:
a) TC=90 W/mK–50 W/mK; R=1.5–1.2 mOhmcm
b) TC=80 W/mK–40 W/mK; R=1.2–0.9 mOhmcm
c) TC=75 W/mK–30 W/mK; R<0.9 mOhmcm.

The radial variation in the resistivity is in this case preferably less than 10%.

EXAMPLE:

(Phosphorus Doping)

With reference to FIG. 1, the continuous line describes the profile of the thermal conductivity of single-crystal silicon with phosphorus doping as a function of the dopant concentration as calculated when employing formula (1). The measurement points show the thermal conductivity which has been actually measured on various specimens of single-crystal silicon produced using formula (2) in accordance with the invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for producing doped semiconductor wafers with a thermal conductivity k from silicon, which contain an electrically active dopant, and are further doped with germanium in a concentration of up to $2 \times 10^{20}$ atoms/cm$^3$, comprising producing a single crystal from silicon and further processing said single crystal to form seimconductor wafers, and setting the thermal conductivity k in accordance with the formula $$k=(1-5.6\times 10^{-21}\, xc(\text{Ge})+1.4\times 10^{-41}\, xc(\text{Ge})^2)/6.8\times 10^{-3}+\text{alpha}\, xc(\text{Dop}))$$

by selecting the concentrations of germanium and of the electrically active dopant, in which formula k is the thermal conductivity at 22° C. in W/mK, c(Ge) and c(Dop) are the selected concentrations of germanium and of the electrically active dopant, respectively, in atoms/cm$^3$, and alpha is a coefficient which has the following values depending on the electrically active dopant:

| | Dopant: | | | |
|---|---|---|---|---|
| | Boron | Phosphorus | Arsenic | Antimony |
| alpha: | $9.57 \cdot 10^{-23}$ | $6.42 \cdot 10^{-23}$ | $2.11 \cdot 10^{-22}$ | $1.30 \cdot 10^{-21}$. |

2. The process of claim 1, wherein the single crystal is pulled from a silicon melt which contains the electrically active dopant and optionally germanium, using the Czochralski method, and the electrically active dopant concentration c(Dop), and germanium concentration c(Ge) in the single crystal are measured.

3. The process of claim 1, wherein the single crystal is pulled from a silicon melt which contains germanium using the Czochralski method, the germanium concentration c(Ge) is measured, the single crystal is processed into batch wafers, wafers are doped with the electrically active dopant by diffusion or ion implantation, and the concentration c(Dop) is measured on a sufficient number of wafers to verify the concentration of electrically active dopant in the batch of wafers.

4. The process of claim 1, wherein boron is an electrically active dopant and the boron concentration is selected in such a manner that one of the following combinations of properties results with regard to thermal conductivity (TC) and resistivity (R) of the semiconductor wafers:
  a) TC<105 W/mK; R>5 mOhmcm,
  b) TC=90 W/mK–30 W/mK; R=5–3 mOhmcm,
  c) TC=80 W/mK–20 W/mK; R=3–2 mOhmcm,
  d) TC=70 W/mK–20 W/mK; R=2–1.5 mOhmcm, and
  e) TC<50 W/mK; R<1.5 mOhmcm.

5. The process of claim 4, wherein the radial variation in the resistivity is less than 8%.

6. The process of claim 1, wherein the semiconductor wafers are doped with phosphorus as an electrically active dopant, and the phosphorus concentration is selected in such a manner that one of the following combinations of properties results with regard to thermal conductivity (TC) and resistivity (R) of the semiconductor wafers:
  a) TC=90 W/mK–50 W/mK; R=1.5–1.2 mOhmcm,
  b) TC=80 W/mK–40 W/mK; R=1.2–0.9 mOhmcm, and
  c) TC=75 W/mK–30 W/mK; R<0.9 mOhmcm.

7. The process of claim 6, wherein the radial variation in the resistivity is less than 10%.

8. The process of claim 1, wherein the semiconductor wafers are used as substrates for electronic power semiconductor components.

9. The process of claim 1, wherein an epitaxial layer is deposited on the semiconductor wafers.

10. The process of claim 1, wherein the single crystal is additionally doped with at least one further dopant.

11. The process of claim 1, wherein the single crystal is additionally doped with nitrogen, carbon or a combination of nitrogen and carbon.

12. A semiconductor wafer formed from silicon, optionally with a deposited epitaxial coating, the wafer being doped with germanium in a concentration of up to $2 \cdot 10^{20}$ atoms/cm$^3$, and with boron, and having one of the following combinations of properties with regard to thermal conductivity (TC) and resistivity (R):
  a) TC<105 W/mK; R>5 mOhmcm,
  b) TC=90 W/mK–30 W/mK; R=5–3 mOhmcm,
  c) TC=80 W/mK–20 W/mK; R=3–2 mOhmcm,
  d) TC=70 W/mK–20 W/mK; R=2–1.5 mOhmcm, and
  e) TC<50 W/mK; R>1.5 mOhmcm.

13. A semiconductor wafer formed from silicon, optionally with a deposited epitaxial coating, the semiconductor wafer being doped with germanium in a concentration of up to $2 \cdot 10^{20}$ atoms/cm3, and with phosphorus, and having one of the following combinations of properties with regard to thermal conductivity (TC) and resistivity (R):
  a) TC=90 W/mK–50 W/mK; R=1.5–1.2 mOhmcm,
  b) TC=80 W/mK–40 W/mK; R=1.2–0.9 mOhmcm, and
  c) TC=75 W/mK–30 W/mK; R>0.9 mOhmcm.

* * * * *

UNITED STATES PATENT AND TRADEMARK OFFICE
CERTIFICATE OF CORRECTION

PATENT NO. : 7,202,146 B2  
APPLICATION NO. : 11/199603  
DATED : April 10, 2007  
INVENTOR(S) : Krautbauer et al.

Page 1 of 1

It is certified that error appears in the above-identified patent and that said Letters Patent is hereby corrected as shown below:

Column 6, Line 20, Claim 12:

Delete:
"e) TC < 50 W/mK; R > 1.5 mOhmcm"
and insert therefor
-- e) TC < 50 W/mK; R < 1.5 mOhmcm --

Column 6, Line 31, Claim 13:

Delete:
"c) TC = 75 W/mK - 30 W/mK; R > 0.9 mOhmcm"
and insert therefor
-- c) TC = 75 W/mK - 30 W/mK; R < 0.9 mOhmcm --

Signed and Sealed this

Twenty-eighth Day of August, 2007

JON W. DUDAS  
*Director of the United States Patent and Trademark Office*